(12) United States Patent
Powell

(10) Patent No.: US 6,214,110 B1
(45) Date of Patent: Apr. 10, 2001

(54) APPARATUS FOR PRODUCING UNIFORM COATING THICKNESS ON A SPHERICAL SUBSTRATE

(75) Inventor: Karlton Powell, Allen, TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/298,795

(22) Filed: Apr. 23, 1999

(51) Int. Cl.[7] .................................................. B05C 3/05
(52) U.S. Cl. ................................................ 118/57; 118/407
(58) Field of Search ........................ 118/57, 303, 320, 118/DIG. 2, 117, 722, 407; 427/346; 438/382, 127

(56) References Cited

U.S. PATENT DOCUMENTS

| 3,640,767 | * | 2/1972 | Fulton et al. . | |
|---|---|---|---|---|
| 4,425,376 | * | 1/1984 | Lee | 118/50 |
| 4,633,804 | * | 1/1987 | Arii | 118/57 |
| 5,462,639 | | 10/1995 | Matthews et al. | 156/662.1 |
| 6,004,396 | * | 12/1999 | Ishikawa . | |
| 6,019,844 | * | 2/2000 | Chiu | 118/57 |
| 6,106,739 | * | 8/2000 | Stephens et al. . | |

FOREIGN PATENT DOCUMENTS 2-119241   10/1988   (JP) .

* cited by examiner

Primary Examiner—Laura Edwards
(74) Attorney, Agent, or Firm—Haynes and Boone, LLP

(57) ABSTRACT

An apparatus and method are provided for applying a uniform liquid coating on a spherical semiconductor device. The present invention includes a multi functional process tube having an end which is covered by a liquid processing material which remains in place due to its surface tension and viscosity. Spherical semiconductor substrates are then dropped through the liquid material and become encapsulated by the fluid. At a subsequent stage in the process tube, vibratory motion is induced in the spheres to cause random motion along a linear combination of the three axes (x, y, z) and distribute the fluid material evenly around the surface of the sphere. The uniformly coated spheres then encounter a heating stage which cause the distributed processing material to become hardened and allow easier handling of the spherical semiconductor substrates for subsequent processing.

17 Claims, 3 Drawing Sheets

APPARATUS FOR PRODUCING UNIFORM COATING THICKNESS ON A SPHERICAL SUBSTRATE

BACKGROUND OF THE INVENTION

The invention relates generally to semiconductor integrated circuits, and more particularly, to an apparatus and method for ensuring that a device such as a spherical-shaped semiconductor integrated circuit is uniformly coated with processing material.

Typically, conventional integrated circuits, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

One processing step that is performed in the fabrication facility is photolithography. Photolithography requires a coating of photo resist material to be placed over the top wafer surface. Additional processing steps may also require that a coating of fluid be placed over the top wafer surface. With traditional flat wafers, these steps are performed in a relatively straight-forward manner, such as by pouring or spraying the fluid onto the wafer and the spinning the wafers to spread the resist.

More particularly, in order to spread the resist evenly across the surface of the wafer to achieve a thickness uniformity to within 2% to 10%, a certain angular velocity in revolutions per minute (RPM) is applied. This will exert a centrifugal force on the liquid resist material while the wafer itself remains horizontal. With conventional wafers, an RPM on the order of approximately 3000 to 4000 will give good results, depending on the wafer size and thickness of the coating desired.

This conventional process invokes both a tangential (until equilibrium is reached) as well as a centrifugal force on the fluid across the wafer surface. This process can be viewed in terms of surface velocity required to shift the liquid resist material uniformly over the surface of the wafer. For conventional two-dimensional (2D) wafers, this process is adequate.

However, a spherical substrate is three-dimensional (3D) and includes three axes of linear movement and three axes of rotational movement, thereby defining six "degrees of freedom." The linear axes represent vibrational movements (resonances) and the three rotational axes represent spin. It can easily be seen that applying the conventional process to distribute liquid resist material along the surface of a wafer is unworkable when applied to a spherical substrate. More particularly, if the spherical substrate is spun on a single axis, different thickness will be produced around the elevation angle of the spin axis, resembling Saturn's rings. Thus, it would be necessary to design equipment to spin the spherical substrate on multiple axes. While multiple spin axes equipment can be designed, a problem exists in that the equipment must contact the sphere.

One method of applying liquid material is by dropping the sphere through a "bubble" of resist material (surface tension method). While the surface tension method produces a consistent thickness on at least one-half of the spherical substrate (typically the front half that originally contacts the material) there tends to be some surface portions that have back-splashed resist onto the back side of the sphere. Those skilled in the art will understand that even slight uneven surface features of the resist coating will cause problems when the resist material is exposed to light during the exposure step of lithography. Typically, this inconsistent coating must be reworked, which is a very expensive process step in the fabrication of integrated circuits.

Therefore, it can be seen that a need exists for an apparatus and method of coating a spherical substrate with a uniform layer of photo-resist material.

SUMMARY OF THE INVENTION

Accordingly, the present invention provides an apparatus and method for coating fluid on a semiconductor device such as spherically shaped semiconductors. Further, the present invention will ensure that the coating applied to the spherical semiconductor device is of a uniform thickness.

Broadly, the present invention includes, in one embodiment, a multi functional process tube having an end which is covered by a liquid processing material which remains in place due to its surface tension and viscosity. Spherical semiconductor substrates are then dropped through the liquid material and become encapsulated by the fluid. Alternate embodiments may use spray-coating and other methods of deposition.

At a subsequent stage in the process tube, vibratory motion is induced in the spheres to cause random motion in the three linear degrees of freedom and distribute the fluid material evenly around the surface of the sphere. The uniformly coated spheres may then encounter a heating stage which causes the distributed processing material to become hardened for subsequent processing and reduce some of the solvent in the resist.

Therefore, in accordance with the previous summary, objects, features and advantages of the present invention will become apparent to one skilled in the art from the subsequent description and the appended claims taken in conjunction with the accompanying drawings.

DETAILED DESCRIPTION OF THE PREFERRED EMBODIMENTS

Figure 1A:
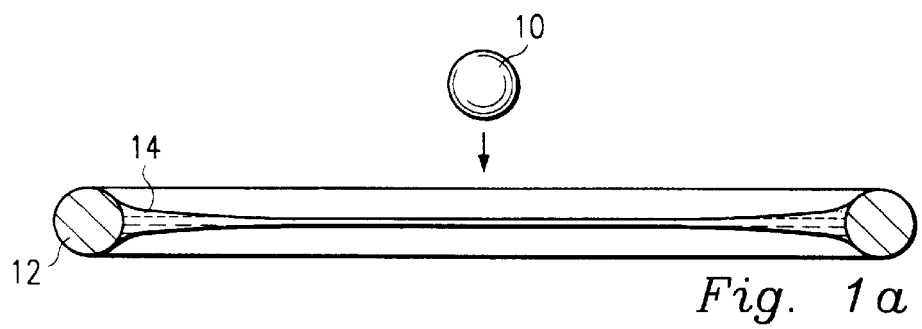
FIGS. 1a, 1b, 1c show a schematic diagram of a spherical substrate being coated with a liquid material using the surface tension method.
Figure 1B:
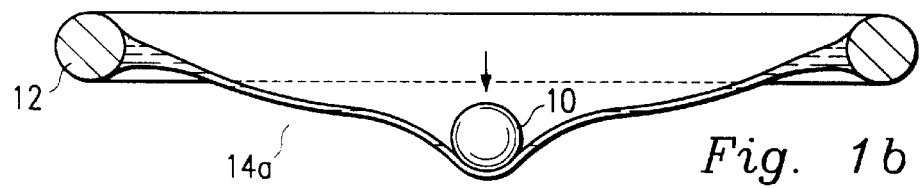
Figure 1C:
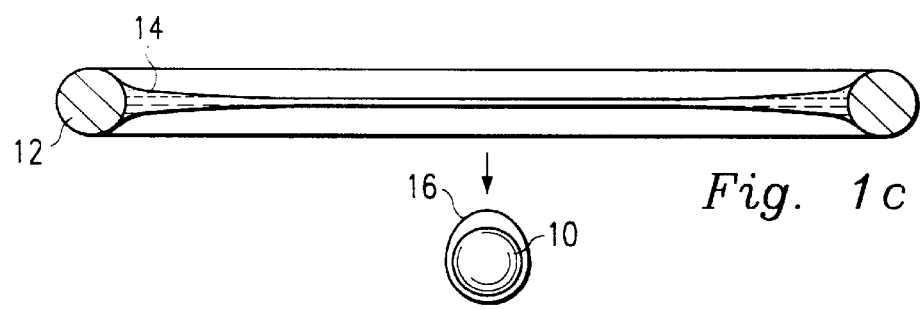
Figure 2:
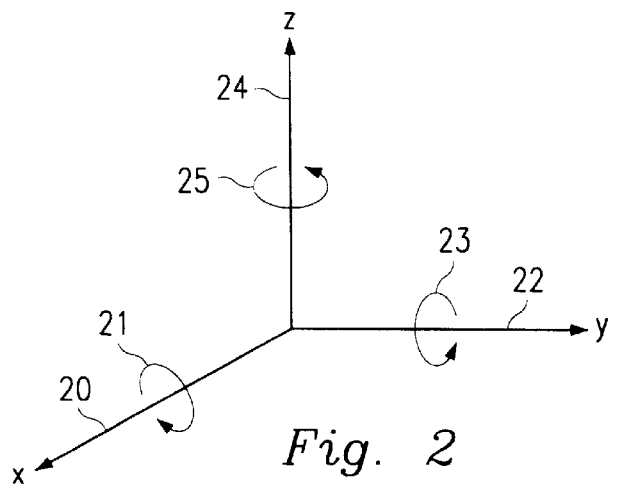
FIG. 2 shows a three dimensional coordinate system and the six degrees of freedom that act on a body.

Referring to FIG. 1, a first stage of a processing tube used to fabricate spherical semiconductor substrates is shown.

The process by which a spherical substrate ("sphere") 10 is coated with liquid material 14, such as a photo resist material, will now be described. In the present embodiment, the sphere 10 is one that may be created according to U.S. patent application filed on May 16, 1997, now U.S. Pat. No. 5,955,776 assigned to the assignee of the present application and herein incorporated by reference.

A ring 12 is shown with liquid resist material 14 applied there across. Those skilled in the art will understand that the viscosity and surface tension of the fluid 14 will cause it to remain in place across the ring 12. As a simplistic example of this characteristic, it can be easily understood when considering the toy commonly used by children to make bubbles. A plastic ring is immersed in a surfactant and when removed a portion of the surfactant is suspended across the plastic ring. When air is moved through the ring, the surfactant is deformed and a bubble is formed. In the case of the present invention, a sphere is dropped through the suspended resist and deforms the resist material. At the point of deformation, the sphere continues through the process tube and the resist material reforms with new liquid provided from a reservoir or other dispensing apparatus. The sphere actually draws more liquid into the suspended area, thereby refilling and maintaining the suspended resist for a next sphere to drop through. For the sake of example, the ring 12 may utilize the teachings of U.S. patent application Ser. No. 60/092,422, filed on Jul. 10, 1998 and assigned to the assignee of the present invention.

It should be noted that the viscosity of the fluid 14 can be varied by such things as adding solvent (thinning). This directly affects the volume of fluid 14 deposited on the sphere. Further, the dimensions (e.g. radius, length, width, shape) and configuration (e.g. rectangle, ellipse, orientation) of the ring 12 can be varied to alter the properties of the fluid resist material 14. It should also be noted that a liquid photo resist material is used in a preferred embodiment of the present invention. However, any other type of processing fluid is contemplated by the scope of the present invention, as are different configurations of devices 10, e.g. cube.

In operation, the sphere 10 is released and falls due to the force of gravity through the liquid and causes it to become deformed as shown by reference numeral 14a. It can be seen that the leading half of the sphere 10 has a thin layer of the material 14a stretched on its surface. As the sphere 10 continues downward through the process tube, the material 14a "snaps" back to its original suspended position leaving a portion of the photo resist material 16 surrounding the sphere 10.

It can be seen from FIG. 1 that the material 16 encapsulating the sphere 10 is not evenly distributed around the trailing one-half of the sphere 10. This uneven distribution can cause problems with the photolithography process step. More particularly, an uneven surface can cause light to expose different amounts of the material and reduce the accuracy of subsequent etch processes for metal layers which are placed on the sphere.

It should be noted that at this point in the processing of the spherical semiconductor 10, the resist material 16 is still in a substantially liquid form, since it has yet to encounter the heating stage. In standard wafer processing, the surface velocity of the liquid resist material is used to distribute it uniformly across the surface. In order for surface velocity to be applied to a three dimensional ("3D") body such as the sphere 10, the parameters for achieving surface velocity must be considered. If the appropriate motion can be applied to the sphere, then surface velocity of the sphere can be used to distribute the liquid uniformly across the sphere's surface.

Fundamentally, in 3D space there are three axes of linear movement and three axes of rotational movement, thereby defining six "degrees of freedom." The linear axes represent vibrational movements (resonances) and the three rotational axes represent spin. Further, for a specific surface velocity on the surface of the sphere 10, it is possible to use any random linear combination of the linear axes, or any linear combination of the rotational axes or any random combination of any three of the six degrees of freedom (3 linear axes+3 rotational axes). A key aspect of the present invention is to involve only a sufficient combination of random motion to achieve the desired result, without requiring an infinite combination which would cause manufacturability to be difficult at best.

Figure 3:
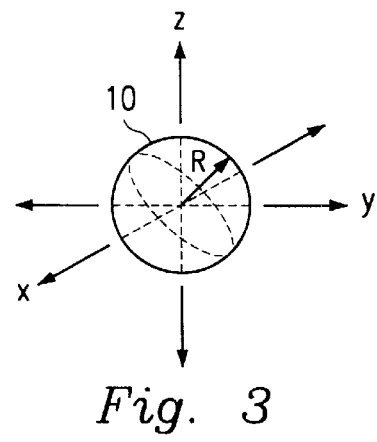
FIG. 3 is a representation of a sphere in conjunction with the three axes of the coordinate system of FIG. 2.

As noted above, the present invention relates to a spherical substrate. It is known that a sphere has a single radius. This can be seen from FIG. 3 where the sphere 10 has a uniform radius R which is rotationally symmetric across any of the axes (x, y, z). Therefore, when determining the random movement to be induced in sphere 10, the rotational aspects of the six degrees of freedom can be eliminated. Thus, by vibrating the sphere 10 in a combination of only three (x, y, z) linear directions, random motion can be achieved.

One aspect of the present invention uses vibration, including acoustic frequencies all the way up to and including ultrasonic frequencies, to achieve the uniform thickness distribution of resist coating.

In one embodiment, the sphere 10 first drops through a tube coating system (FIG. 1), or through other depositions methods, such as spraying. Once the liquid 14 has been applied to the sphere 10, it is then vibrated at a vibration stage. The vibration stage is a segment of tubing that has the capability of vibrating the gaseous environment surrounding the sphere 10. A broad range of frequencies could be used for this purpose, however, optimum efficiency is desired when attempting to transfer as much kinetic vibrational energy to the sphere. It is especially difficult to transmit energy through the gas disposed between the tube wall and the sphere itself, as compared with direct physical contact. Therefore, at least two important items should be considered: (1) resonant frequency of the sphere; and (2) resonant frequency of the tube system (which effectively acts as a pipe organ pipe). Of these two consideration, item (2) is of more concern, but designing a system to address both concerns would be most beneficial since, among other things, no contact with the tube wall is desired.

To find the resonance of the tube, a frequency generator can be used. Frequencies can be varied gradually until resonance of the system is found when large amplifications of the signal cross one another. Also, harmonics of the system can be used as they are integral multiples of the fundamental system frequency. This system can be achieved in one scenario by utilizing acoustic waves. Although ultrasonic waves may work sufficiently, the preferred embodiment of the present invention uses acoustic waves in the audible range. It may be necessary to tune the system through design and experimentation to find the optimum frequency.

A system including audio speakers and/or piezo electric oscillators can be used with a sound frequency generator to aid in finding system resonance/optimization. As the sphere passes through the nodes and antinodes of the tuned pipe system, the sphere will go into and out of vibration zones. The induced vibration will effectively "shake" the liquid resist material around the sphere's surface to a uniform thickness. As frequencies increase the sound waves become much more directional and the vibrational effect can therefore become more localized.

Further, embodiments show that when a sphere is progressing through the tube, waves can be bombarded at various angles to achieve random vibrational axes of motion. Further, using "white" noise is also useful to aid in the random choice of frequencies. White noise is defined as a random combination of frequencies. Another possible solution is to induce rotational movement in the sphere while it is dropping to achieve similar results. However, from an implementation standpoint, rotational movement must be controlled since any deflection normal to gravity can cause the sphere to become stuck to the inside surface of the process tube. To allow for some deflection, a proper tube-to-sphere diameter ratio can be used, along with a counter-flow of gas, to keep the sphere from the inside surface of the process tube. When either, or all of these steps are implemented, the coating thickness on the sphere will be extremely consistent.

It is noted that random, or chaotic movement is the most beneficial type of motion, e.g. chaos is being used to create a coating that is uniform, or consistent. A main factor is to vibrate the resist coat on the sphere in order to smooth out the thickness evenly over the entire sphere while processing the sphere (dropping it through the process tube) and avoiding contact between the sphere and tube.

The preferred embodiment, discussed in more detail below, uses piezo mechanical oscillators, such as a piezo tweeter, can oscillate into the ultrasonic range. Another embodiment may use a high pressure gas flow to generate ultrasonic waves. To optimize the energy transferred to the sphere, a design using a concave, focused piezo/ceramic (FIG. 6) could be used to increase the intensity of vibration at the sphere by hundreds of times.

Figure 4:
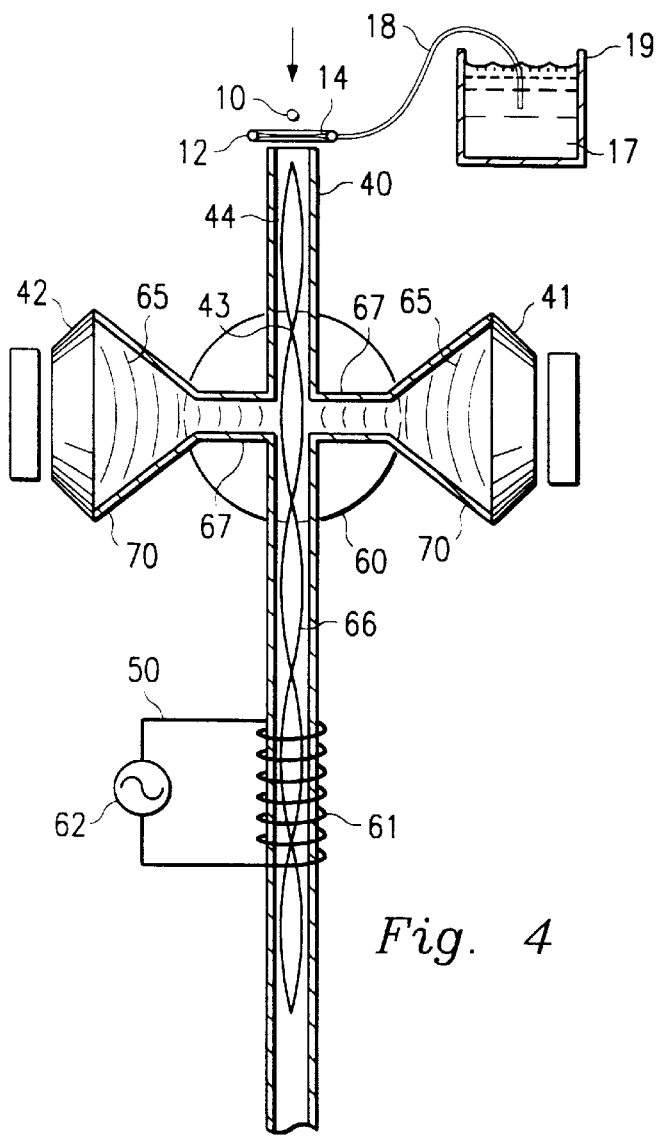
FIG. 4 is a first embodiment of the present invention showing the multi functional process tube with a stage that induces random, non-contact vibratory motion in the spherical semiconductor.

FIG. 4 illustrates a schematic diagram of a process tube 40 incorporating a preferred embodiment of the present invention. The tube 40 is shown having a resist material coating portion with the distribution ring 12 with liquid resist material 14 suspended there across by a combination of viscosity and surface tension, as previously described with reference to FIG. 1. A reservoir 19 includes a supply of resist material 17 that is used to replenish the suspended fluid 14 on ring 12 through a capillary tube 18. Of course many other types of fluid distribution systems are possible and contemplated by the present invention, such as capillary tube action or spraying.

The sphere 10 is shown positioned above the suspended resist material 14 prior to the point where it drops through the material and becomes encapsulated thereby. Piezoelectric oscillators 41, 42 and 60 are shown disposed around the tube 40 at a vibration stage. Those skilled in the art will understand that these oscillators transform electrical energy into mechanical vibrations to generate acoustic waves 65. In this embodiment oscillators 41, 42 and 60 are disposed at the end of a hollow funnel shaped member 70 having a substantially conical or exponential shaped portion in communication with cylindrical section 67. In this manner the waves 65 are guided to the interior of the process tube 40. Of course, other configurations of this vibration generating portion are possible and contemplated by the scope of the present invention.

Waves 65 converge in the tube 40 and create a harmonic wave having a node point 43 and an antinode portion 44. The vibrational energy is maximized at antinode 44, whereas waves 65 tend to cancel one another at nodes 43. Therefore, it can be seen that optimum vibration will occur when sphere 10 is passing through antinodes 44.

FIG. 4 also shows a preferred disposition of the acoustic vibration generators 41, 42 and 60 around tube 40. That is, four acoustic vibration generators extend outward from tube 40 at 90 degree angles to one another and the linear surface of the tube. Two of the four generators are shown by reference numerals 41 and 42. A third acoustic generator extends outwardly from FIG. 4 (towards the viewer) and a fourth acoustic generator (not shown) can be disposed opposite of the third generator and extending inwardly from FIG. 4 (away from the viewer). Of course, many other configurations of acoustic generators are possible, such as using only three generators disposed around tube 40 at an angle of 120 degrees to one another.

After the step of randomly vibrating sphere 10 to evenly distribute the resist material, a heating stage is encountered. Heater 50 will cause the resist material surrounding sphere 10 to become hardened, will remove some of the solvents in the resist, and allow for easier handling in subsequent processing steps. Although many types of heaters can be used to increase the temperature of the air in tube 40, an electrical resistance type heater 50 is shown in FIG. 4. The heater 50 passes electrical energy through high resistance coils 61 that generate heat inside the tube 40. An electrical power source 62 is also included to provide the electrical energy to the coils 61. Although not shown, other controls will typically be provided with the heater 50, such as a thermostat which monitors the temperature in the tube 40 and controls the amount of electricity provided to the coils 61 accordingly.

After the sphere 10 passes through the heating stage, the resist material is sufficiently hardened to allow for additional processing, such as is required for photolithography, etching, and metal deposition, to fabricate a spherical integrated circuit.

Figure 5:
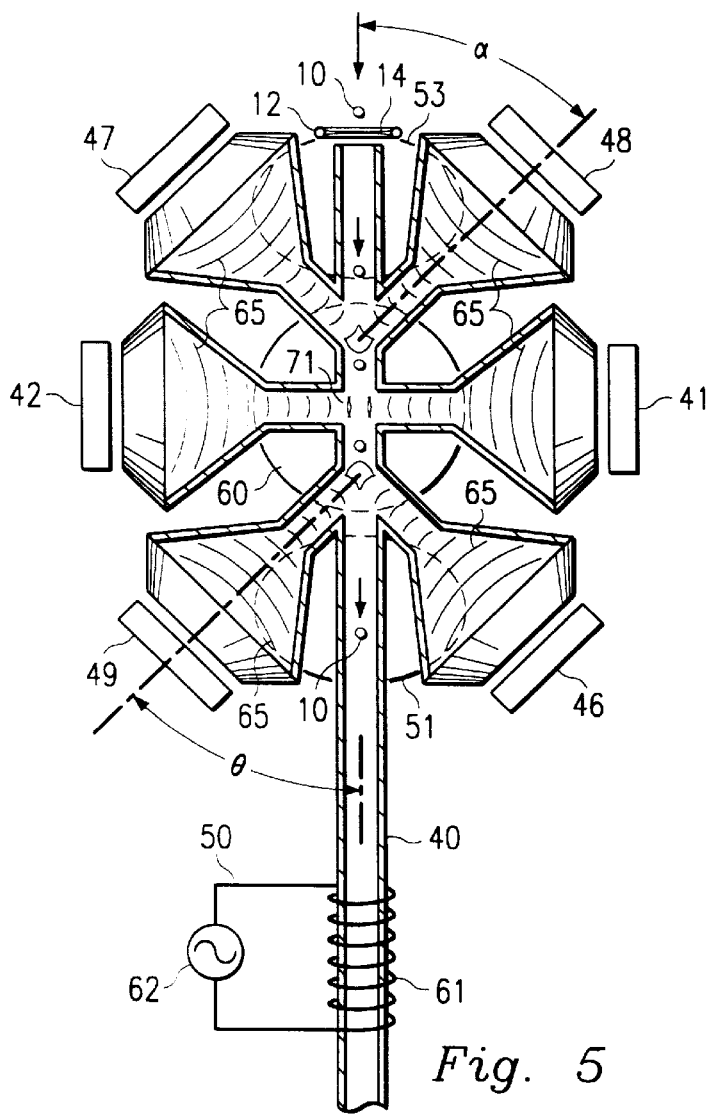
FIG. 5 is another embodiment of the process tube of FIG. 4 having a different configuration of the stage that causes vibration in the spherical substrate.

FIG. 5 describes another embodiment of the present invention wherein the process tube 40 includes multiple angularly disposed acoustic generators. Again, in a coating stage, sphere 10 proceeds through the suspended resist material 14, which envelops the sphere. At the vibration stage, generators 41, 42 are shown with the third and fourth generators (not shown) included in a right angle configuration with the process tube 40 and the generators 41, 42, such as is described with respect to FIG. 4. In this embodiment, additional acoustic generator sets are also disposed around tube 40 above and below the first set of four generators (generators 41, 42, et al.). A second set includes generators 47, 48 and 53 (shown in phantom) and a fourth generator (not shown) opposite generator 53. This second set is disposed at an angle alpha relative to tube 40. A third set of vibration generators 45, 49, 51 (shown in phantom) and a fourth generator (not shown, but opposite to the generator 51) are angularly disposed below the first four generators 41, 42, et al. at an angle theta relative to tube 40. In one embodiment, the angles alpha and theta may be equal to one another.

It can be seen that acoustic waves 65 will converge on a vibration zone 71 which occurs where the waves 65 from all of the included acoustic generators meet and interact with one another. As the sphere 10 passes through this vibration zone, it is randomly vibrated by waves 65 and combinations thereof to distribute the resist material 14 to an even thickness. As noted above, in a preferred embodiment, the acoustic generators of FIGS. 4 and 5 will output "white" noise, which is random by definition. Of course various other frequencies could be output by the acoustic generators that will create random vibrational energy when combined.

Again, it should be noted that many different configurations and types of acoustic generators can be used in accordance with the present invention. For example, the angles alpha and theta and be varied independently to optimize the random nature of the vibrations at zone 71. Further, additional sets of generators can be disposed along tube 40, or more individual vibrational generators can be added to each set.

Figure 6:
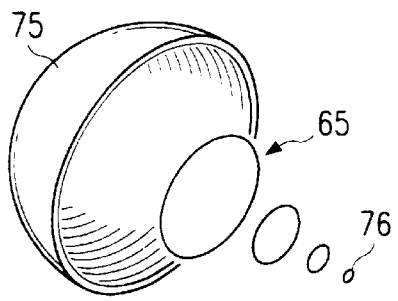
FIGS. 6, 6a provide side vieww of directional acoustic generators and their output.
Figure 6A:
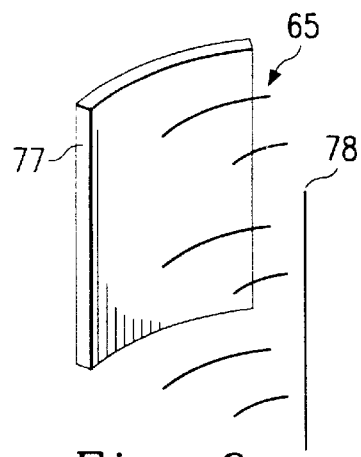

FIGS. 6, 6a show another embodiment for a type of directional acoustic generator that could be used in conjunction with tube 40 to induce random vibrations in sphere 10. It can be seen that a concave piezoelectric material 75 (FIG. 6) is used to cause acoustic waves 65 to be focused at an area 76, thereby concentrating the acoustic energy at this particular point. Likewise, a curved piezoelectric material 77 (FIG. 6a) is used to cause the acoustic waves 78 to be focused at an area 78, thereby concentrating the acoustic energy at this particular line. One or more of these directional generators 75 or 77 could be disposed along tube 40 in a manner similar to the acoustic generators of FIGS. 4 and 5. By varying the configuration and/or frequency output, it may be possible to introduce random vibrations using a lesser number of directional generators 75 or 77 than possible with the same number of standard generators.

Figure 7:
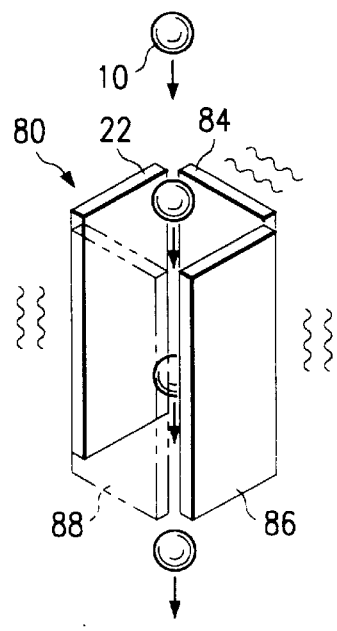
FIG. 7 is an alternate embodiment of the present invention that induces random, non-contact vibratory motion similar to that shown in FIG. 4.

FIG. 7 shows an alternate embodiment to the tube 40 of FIG. 4. A square-shaped tube 80 includes four acoustic vibration generators 82, 84, 86 and 88. These generators 82–88 may be piezo walls that entirely surround an interior chamber of the tube 80. The piezo walls 82–88 provide different vibratory motion than those of FIG. 4.

Figure 8A:
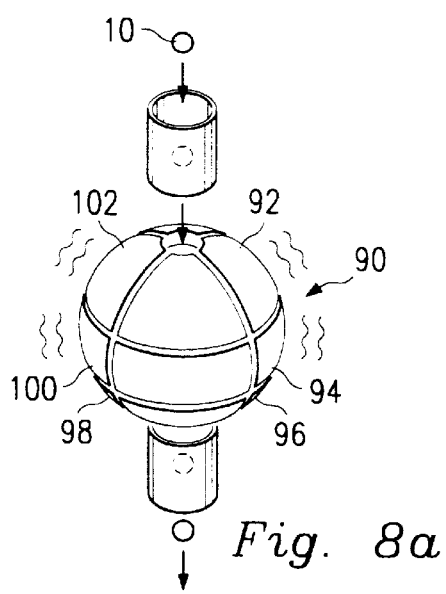
FIGS. 8a, 8b illustrate an alternate embodiment of the present invention that induces random, non-contact vibratory motion similar to that shown in FIG. 4.
Figure 8B:
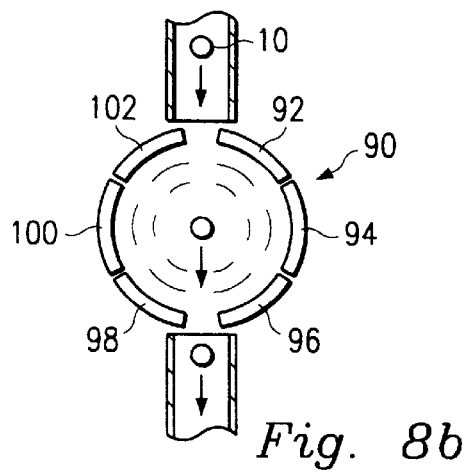

FIGS. 8a and 8b show an alternate embodiment to the tube 40 of FIG. 4. A sphere-shaped tube 90 includes twelve acoustic vibration generators 92, 94, 96, 98, 100, 102 and six others not shown. The twelve generators together form equal sized portions of the sphere-shaped tube 90, with openings 104, 106 for receiving and expelling the sphere 10 as it passes there through.

Although certain preferred embodiments, or examples, have been shown and described, it should be understood that many changes and modifications may be made therein without departing from the scope of the appended claims. For example, as noted above, ultrasonic waves may be used to induce the random vibrations in tube 40 that cause resist material 14 to be distributed evenly around sphere 10. Furthermore, contact as well as non-contact processing can benefit from the present invention. For example, solid-to-solid and liquid-to-solid contact of the sphere 10 may be utilized during vibration to achieve similar results. Accordingly, the claims listed below should be interpreted broadly and in a manner consistent with the invention.

What is claimed is:

1. An apparatus for uniformly coating a spherical semiconductor with processing material, comprising:
   means for encapsulating the spherical semiconductor with the processing material;
   a tube for receiving the encapsulated spherical semiconductor and allowing the semiconductor to move there through without contact; and
   means connected to the tube for inducing vibratory motion in a central portion of the tube for causing the processing material to be uniformly distributed over the surface of the spherical semiconductor while the semiconductor moves through the central portion.

2. The apparatus of claim 1 wherein the encapsulating means comprises one or more sprayers.

3. The apparatus of claim 1 wherein the encapsulating means comprises means for suspending a portion of the processing material through which the spherical semiconductor may move.

4. The apparatus of claim 1 wherein the means for inducing vibratory motion is positioned to vibrate an axial, interior length of the tube, the axial, interior length including the central portion of the tube.

5. The apparatus of claim 1 wherein the processing material is photo resist.

6. The apparatus of claim 1 wherein the means for inducing vibratory motion is of a type that vibrates the spherical semiconductor in a linear degree of freedom.

7. The apparatus of claim 1 wherein the means for inducing vibratory motion is of a type that vibrates the spherical semiconductor in three linear degrees of freedom.

8. The apparatus of claim 1 further comprising:
   means for providing rotational movement to the spherical semiconductor.

9. An apparatus for uniformly coating a spherical semiconductor with processing material, comprising:
   means for encapsulating the spherical semiconductor with the processing material;
   means for inducing vibratory motion in the encapsulated spherical semiconductor; and
   a tube for surrounding the spherical semiconductor when it vibrates;
   wherein the vibratory motion causes the processing material to be uniformly distributed over the surface of the spherical semiconductor; and
   wherein the vibratory motion vibrates at a frequency determined by the resonant frequency of the tube.

10. The apparatus of claim 1 wherein the wherein the means for inducing vibratory motion is of a type that vibrates at a resonant frequency of the spherical semiconductor.

11. The apparatus of claim 1 further comprising:
    a tube for surrounding the spherical semiconductor when it vibrates;
    wherein the vibratory motion vibrates at a harmonic frequency determined by one of either the resonant frequency of the tube or the resonant frequency of the spherical semiconductor.

12. The apparatus of claim 1 wherein the means for inducing vibratory motion is of a type that vibrates at a random frequency.

13. The apparatus of claim 1 further comprising:
    a tube for surrounding the spherical semiconductor when it vibrates;
    wherein the vibratory motion includes one or more acoustic generators attached to the tube.

14. The apparatus of claim 1 further comprising:
    a tube for surrounding the spherical semiconductor when it vibrates;
    wherein the vibratory motion includes one or more piezo mechanical oscillators attached to the tube.

15. A system for coating a fluid onto a surface of a three dimensional device, the system comprising:
    an applicator for applying the fluid to the surface of the device;
    a chamber having an inlet and an outlet, the inlet positioned for receiving the device from the applicator and the outlet positioned to allow the device to move through the chamber without physical contact;
    a plurality of vibrators for providing a vibration energy to a central portion of the chamber, the vibration energy being of a type that vibrates the device, thereby spreading the applied fluid evenly across the surface of the device.

16. The system of claim 15 wherein the vibration energy of each vibrators combine to form a harmonic vibration frequency that extends along a movement path of the device between the inlet and outlet of the chamber.

17. The system of claim 15 wherein the plurality of vibrators are positioned in a spherical configuration so that vibration energy is equally provided to the central portion of the chamber from opposite directions.

* * * * *